United States Patent
Akatsu et al.

[11] Patent Number: 6,021,789
[45] Date of Patent: Feb. 8, 2000

[54] WAFER CLEANING SYSTEM WITH PROGRESSIVE MEGASONIC WAVE

[75] Inventors: Hiroyuki Akatsu, Yorktown Heights, N.Y.; Soichi Nadahara, Yokohama, Japan

[73] Assignees: International Business Machines Corporation, Armonk, N.Y.; Kubushiki Kaisha Toshiba, Kawasaki, Japan

[21] Appl. No.: 09/189,429

[22] Filed: Nov. 10, 1998

[51] Int. Cl.[7] .................................................. B08B 3/10
[52] U.S. Cl. ..................... 134/57 R; 134/58 R; 134/184; 134/902
[58] Field of Search .................. 134/58 R, 902, 134/153, 181, 184, 1, 1.3, 56 R, 18, 57 R, 25.4

[56] References Cited

U.S. PATENT DOCUMENTS

| | | |
|---|---|---|
| 2,985,003 | 5/1961 | Gelfand et al. . |
| 3,117,768 | 1/1964 | Carlin . |
| 4,064,885 | 12/1977 | Dussault ................................ 134/58 R |
| 4,326,553 | 4/1982 | Hall ........................................ 134/153 |
| 4,768,256 | 9/1988 | Motoda .................................. 15/250 R |
| 4,909,266 | 3/1990 | Massa . |
| 5,090,432 | 2/1992 | Bran ...................................... 134/139 |
| 5,133,376 | 7/1992 | Samarin et al. . |
| 5,286,657 | 2/1994 | Bran ............................................. 437/9 |
| 5,361,449 | 11/1994 | Akimoto .................................. 15/302 |
| 5,368,054 | 11/1994 | Koretsky ................................ 134/184 |
| 5,383,484 | 1/1995 | Thomas et al. . |
| 5,562,778 | 10/1996 | Koretsky et al. ............................ 134/1 |
| 5,601,655 | 2/1997 | Bok et al. ................................... 134/1 |
| 5,762,779 | 6/1998 | Shiramizu ............................... 205/746 |
| 5,779,796 | 7/1998 | Tomoeda ................................. 118/319 |

FOREIGN PATENT DOCUMENTS

| | | |
|---|---|---|
| 61-016528A | 1/1986 | Japan . |
| 0025538 | 1/1990 | Japan . |
| 3019337A | 1/1991 | Japan . |

OTHER PUBLICATIONS

C.J. Keller, "Ultrasonic Fountain Processor", IBM Technical Disclosure Bulletin, vol. 10, No. 5, Oct. 1967, pp. 528–529.

*Primary Examiner*—Frankie L. Stinson
*Attorney, Agent, or Firm*—Steven Capella

[57] ABSTRACT

Improved megasonic cleaning is obtained by use of an apparatus containing a plurality of transducers arranged to transmit a progressive megasonic wave through a liquid containing a planar surface of an object. The progression of the wave is preferably such that particles are carried by the wave toward the toward the edge of the wafer. The processes and apparatus are especially useful for cleaning wafers in the course of manufacturing integrated circuit chips.

18 Claims, 3 Drawing Sheets

WAFER CLEANING SYSTEM WITH PROGRESSIVE MEGASONIC WAVE

BACKGROUND OF THE INVENTION

With decreasing feature size and more intricate fabrication techniques for wafer-based integrated circuit chips, wafers and the resulting integrated circuit chips have become increasingly sensitive to extraneous or unwanted material on the wafer/chip surface during and after processing. The presence of these unwanted materials either at intermediate fabrication stages or at the end of manufacture often adversely affects product performance reliability. Thus, lack of adequate control of these unwanted materials can result in a loss of yield (reliable chips) and/or failure of the products in use.

Unwanted materials on the wafer/chip surface can be introduced from the external environment (e.g., dust in the air). More often however, unwanted material is introduced as a result of chip fabrication steps which cause deposition of unwanted material on the wafer surface. For example, chemical-mechanical polishing (CMP) processes are used to planarize wafers and/or to planarize layers deposited on wafers (e.g., polycrystalline silicon, tetraethylorthosilicate (TEOS), Al—Cu alloy, etc.). Frequently, residual material detached from the wafer in the course of CMP processes remains on the wafer surface as debris. CMP polishing particles may also remain on the wafer surface after the CMP process step. Other unwanted materials may be introduced to the wafer surface during the course of other processes routinely used in the manufacture of integrated circuit, e.g. processes such as chemical vapor deposition (CVD), wet etching or dry etching.

The desire to control the amount of unwanted material on the wafer/chip surface during manufacture has led to the development of a variety of wafer cleaning processes. Most cleaning processes involve the use of liquids which contact the wafer surface. In some instances, the liquid-based cleaning processes may be combined with mechanical cleaning processes (e.g., brushing off the wafer surface) or other cleaning processes. One technique of introducing mechanical energy into the cleaning process has been by the use of ultrasonic and megasonic transducers. The use of megasonic transducers has been more advantageous since the megasonic frequencies correspond more closely to the resonant frequencies of most unwanted material particles. The use of megasonic transducers has generally involved directing the megasonic energy into the container holding the wafer and cleaning liquid.

While the use of megasonic energy has resulted in improved cleaning, the wafer may still have particles of unwanted material remaining on the surface after removal from the cleaning environment. Thus, there remains a need for further improved cleaning processes.

SUMMARY OF THE INVENTION

The invention provides an improved megasonic cleaning process as well as apparatus for carrying out the megasonic cleaning processes of the invention. The processes of the invention are generally characterized by the formation of progressive megasonic wave at a surface of the wafer. The use of progressive wave megasonic cleaning provides improved cleaning performance for a given cleaning protocol. The apparatus of the invention is generally characterized by the presence of means which can be operated to create a progressive megasonic wave at the surface of the wafer.

In one aspect, the invention an apparatus for contacting a substantially planar surface of an object with a liquid, the apparatus comprising:

(a) means for holding the object whereby at least a portion of the planar surface is exposed;

(b) means for supplying the liquid whereby at least a portion of the liquid is brought into contact with the exposed planar surface;

(c) a plurality of transducers in contact with the liquid near the exposed planar surface, the transducers being capable of operating at megasonic frequencies and the transducers being sufficiently proximate such that a progressive megasonic wave may be formed in the liquid near the exposed surface;

(d) an electronic means for controlling the operating frequency of the transducers and a phase relationship of the transducers in a manner to create a progressive megasonic wave in the liquid near the exposed surface.

Preferably, the apparatus is adapted to hold a wafer and use a liquid adapted to facilitate cleaning or other processing of the wafer.

In another aspect, the invention encompasses a method of contacting a substantially planar surface of an object with a liquid, the method comprising:

(a) holding the object whereby at least a portion of the planar surface is exposed and a gap between the surface and a plurality of transducers is established;

(b) supplying the liquid into the gap whereby at least a portion of the liquid is brought into contact with the exposed planar surface and the transducers; and (c) applying megasonic energy to the liquid in the gap, the transducers being operated at megasonic frequencies and in a phase relationship to establish a progressive megasonic wave in the liquid in the gap.

Preferably, the methods of the invention are used to treat wafers such a silicon wafers used in the manufacture of integrated circuit chips. The methods of the invention preferably use an aqueous liquid.

These and other aspects of the invention are discussed in further detail below.

DETAILED DESCRIPTION OF THE INVENTION

The invention generally encompasses the use of an apparatus containing a plurality of transducers arranged to transmit a progressive megasonic wave through a liquid containing a planar surface of an object. The method and apparatus of the invention can be used to provide improved megasonic cleaning and other improved processes involving the application of megasonic energy to liquids contacting a surface to be treated. The processes and apparatus of the invention are especially useful for cleaning wafers in the course of manufacturing integrated circuit chips.

The apparatus of the invention is generally characterized by the presence of a plurality of transducers and one or more controllers for controlling the operation of the transducers such that one or more progressive megasonic waves is established in a liquid medium along a substantially planar surface of an object (typically a wafer to be cleaned or treated) by the operation transducers.

The apparatus of the invention preferably comprises:

(a) means for holding an object, the object having a substantially planar surface, whereby at least a portion of the planar surface is exposed;

(b) means for supplying a liquid whereby at least a portion of the liquid is brought into contact with the exposed planar surface;

(c) a plurality of transducers in contact with the liquid near the exposed planar surface, the transducers being capable of operating at megasonic frequencies and the transducers being sufficiently proximate such that a progressive megasonic wave may be propagated by the transducers in the liquid near the exposed surface; and (d) an electronic means for controlling the operating frequency of the transducers and a phase relationship of the transducers in a manner to create a progressive megasonic wave in the liquid near the exposed surface.

Means for holding the object may be any object holder commonly used to hold the object to be treated. Preferably, the object holder is suitable for holding a wafer such as semiconductor wafers commonly used in the manufacture of integrated circuit devices. The holder may be a simple vacuum chuck supported on a rotatable shaft such as described in U.S. Pat. Nos. 4,326,553 and 4,064,885, the disclosures of which are incorporated herein by reference. Alternatively, the holder may be one which engages edges of the object such as disclosed in U.S. Pat. Nos. 5,361,449 and 5,286,657, the disclosures of which are incorporated herein by reference. Where an edge-engaging holder is used, preferably the holder engages simultaneously the edges of the object at at least three distinct points, more preferably at least four distinct points. Preferably, the no set of three engaging points are colinear with each other. Edge-engaging holders are preferred where simultaneous treatment of two sides of a wafer is desired.

Figure 1:
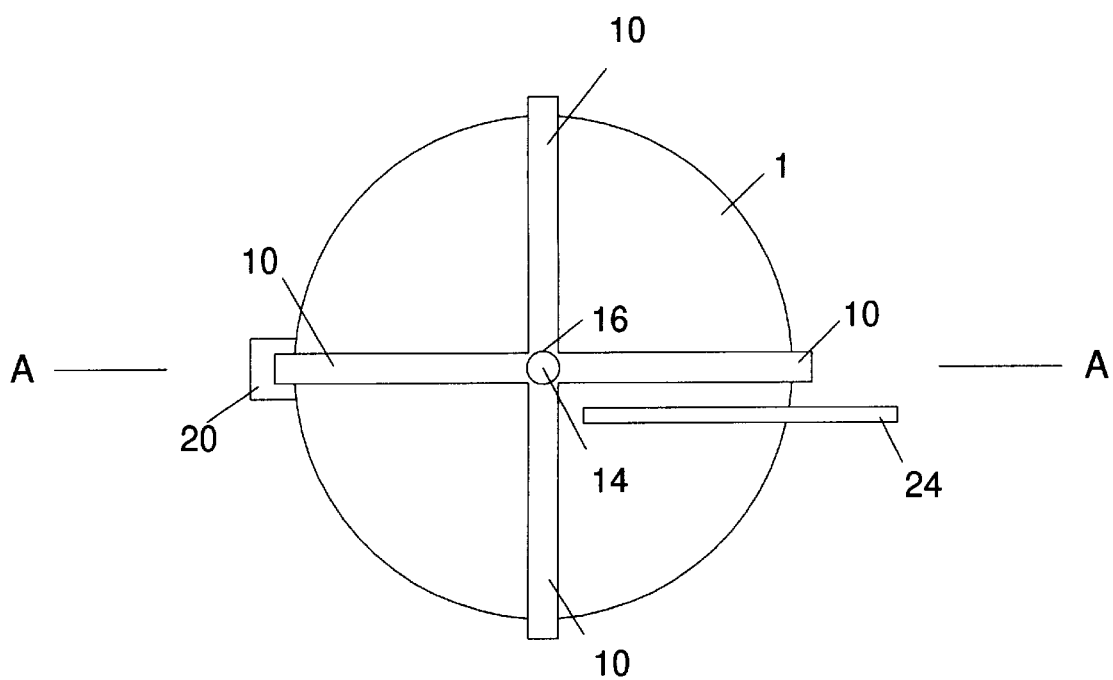
FIG. 1 is a schematic plan view of an apparatus of the invention including a wafer holder above a member containing a plurality of transducers.
Figure 2:
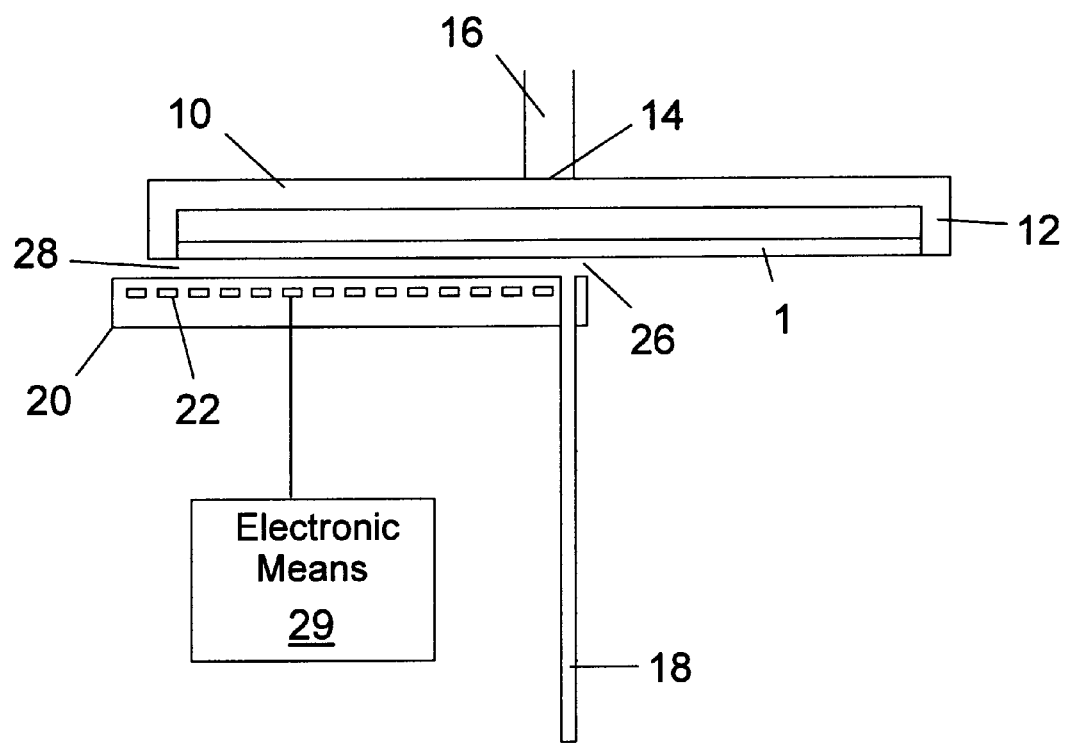
FIG. 2 is a cross sectional schematic illustration of the apparatus of FIG. 1 taken along line A—A showing a member containing a plurality of transducers and a planar surface of an object to be treated.

FIGS. 1 and 2 show an embodiment of the invention where an edge-engaging holder is used. The holder has four gripping arms 10 with gripping edges 12 which grip a wafer 1. The arms are connected at an axis point 14. A shaft 16 for rotating the gripping arms (to thereby rotate a held wafer) is attached to the arms at axis point 14. Shaft 16 is preferably attached to a rotating means such as described in the above mentioned patents.

The apparatus of the invention includes means for supplying a liquid whereby at least a portion of the liquid is brought into contact with the exposed planar surface of the object. The liquid supply means is preferably one or more pipes such as pipe 18 in FIG. 2. At least one liquid supply means is located beneath the object wafer 1, such that it can supply liquid to contact the planar surface of object wafer 1 at a location on the planar surface that directly overlies a member 20 containing a series of megasonic transducers 22. The liquid supply means may further include a pressurized source (not shown) of the liquid to be used for treating the object surface. In addition to pipe 18, a further pipe 24 may be present over the object wafer 1 as shown in FIG. 1. Pipe 24 may be used to deliver liquid for simultaneous treatment of an additional surface of the wafer object 1. Preferably, the liquid supply means made of a suitable material for delivery of neutral or acidic aqueous liquids. If desired, additional liquid pipes can be placed at desired locations about the object to provide additional supplies of liquid to a surface of the object.

The apparatus of the invention contains a plurality of transducers 22 which are used to propagate a progressive megasonic wave in the liquid near the exposed planar surface of the object. The transducers are capable of operating at megasonic frequencies (0.8–6 MHz). The transducers are preferably oriented to have a direction of excursion or vibration substantially normal to the planar surface to be treated. The transducers are sufficiently proximate to each other and to the exposed planar surface to be treated such that a progressive megasonic wave can be propagated by the transducers in the liquid near the exposed surface. Preferably, the plurality of transducers comprises at least three transducers which are colinear in a plane parallel with the exposed planar surface of the object. As shown in FIG. 1, preferably at least three of the transducers form a line extending from an interior region 26 of the planar surface toward an outer edge 28 of the planar surface. This radial orientation of the transducers allows for propagation a progressive megasonic wave radially outward from interior (preferably center) of the planar surface to be treated. Preferably, sufficient transducers are radially oriented in this manner to create a progressive megasonic wave in the liquid from the center of the planar surface to an edge of the wafer or more preferably to beyond the edge of the wafer. In this way, the action of the progressive wave will be more uniform along the entire radial distance along the object surface.

The transducers may be any conventional transducers commonly used in megasonic cleaning. The transducers are preferably housed in a housing member 30. The housing preferably has a flexible impermeable membrane which is coupled with the action of the transducers to transmit the energy of each of the plurality of transducers to the liquid supplied thereover. The membrane may be of any type commonly used to transfer megasonic energy to a liquid in conventional megasonic cleaning processes.

Figure 3:
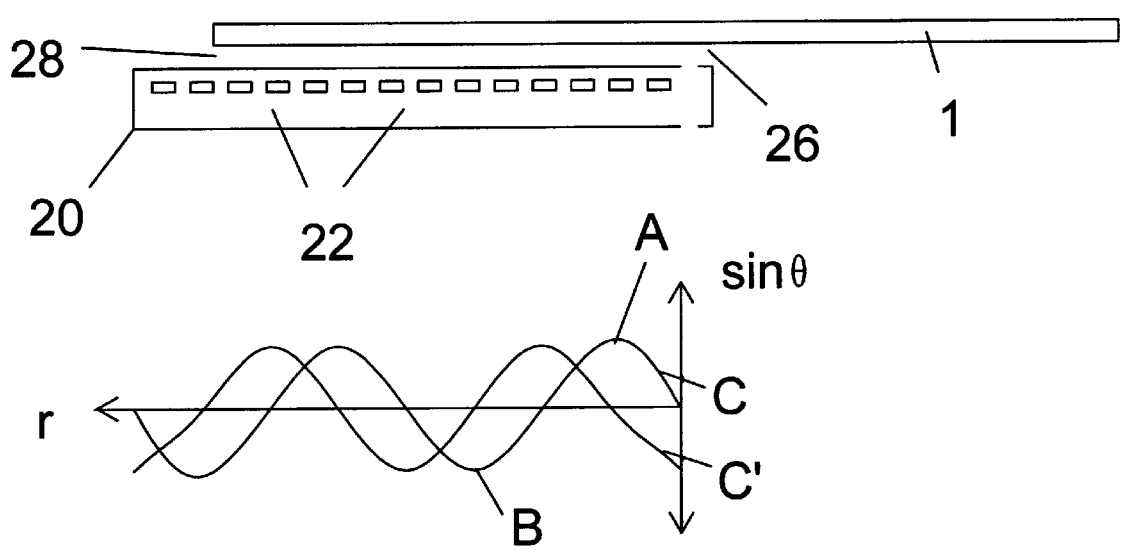
FIG. 3 is the cross section of the wafer and member of FIG. 2 with a corresponding plot of the megasonic wave front as a function of distance along the transducer-containing member.

The apparatus includes an electronic means 29 for controlling the operating frequency of the transducers and a phase relationship of the transducers in a manner to create a progressive megasonic wave in the liquid near the exposed surface. The transducers are typically piezoelectric devices which are driven by an electric power source operating at the desired megasonic frequency. Preferably, all the transducers are operating at the same frequency. In some instances, it may be possible to vary the frequency of operation of subsets of transducers provided that the overall progressive wave is maintained. Operating the transducers at different phases is generally necessary to establish the progressive wave. An example of a phase relationship is shown in FIG. 3. The two curves, C and C', show the effective operation ($\sin \theta$) of the transducers at two different times as a function of distance (r) along member 20. Points A and B in FIG. 3 represent effective transducer operation points that are 180° out of phase. It should be understood that the effect of each transducer extends to a certain region within the liquid. Thus, the progressive wave can correspond to the positioning of transducers located at other locations and spacings provided that the proper phase relationship is maintained. Electronic circuitry for creating the proper phase relationship in a series of transducers is described in U.S. Pat. No. 4,768,256, the disclosure of which is incorporated herein by reference.

The apparatus preferably further comprises means for moving the object in a plane parallel with the planar surface whereby different portions of the planar surface are contacted by the portion of the liquid carrying the propagated progressive megasonic wave. The means for moving said object preferably comprises a means for rotating said object in a plane parallel with the planar surface. The rotation preferably is about an axis which is normal to the planar surface, the rotation axis preferably passing through the center of the planar surface. Examples of suitable rotating means are disclosed in the above mentioned patents which describe various wafer holders. If desired, the megasonic transducer member 20 may rotated or moved relative to the object surface (e.g., as an alternative or supplement to moving the object), however, this is generally not preferred.

The apparatus of the invention may include other expedients such as a collecting tank (not shown) for collecting liquid flowing over the megasonic cleaning member 20 or flowing off the object. Depending on the treatment operation being performed, it may be possible to reuse the liquid (with or without some form of remediation). If desired, the apparatus of the invention may include plural members 20, each containing a set of megasonic transducers operating to create a corresponding progressive megasonic wave. It should be understood that the various parts of the apparatus of the invention may be fixed in space and/or coupled to each other as appropriate to the intended function by attachment to the desired parts to each other or to other structures (e.g. chamber walls, support stands, etc.) as may be known in the art.

The invention encompasses methods of contacting a substantially planar surface of an object with a liquid wherein a progressive megasonic wave is propagated through the liquid at the planar surface. The methods of the invention preferably comprise:

(a) holding the object whereby at least a portion of the planar surface is exposed and a gap between the surface and a plurality of transducers is established;

(b) supplying the liquid into the gap whereby at least a portion of the liquid is brought into contact with the exposed planar surface and the transducers; and (c) applying megasonic energy to the liquid in the gap, the transducers being operated at megasonic frequencies and in a phase relationship to establish a progressive megasonic wave in the liquid in the gap.

The planar surface is preferably moved in a plane parallel with the planar surface whereby the liquid in the gap contacts a further portion of the substantially planar surface. Preferably, the movement involves rotating the object about a center point in the planar surface (e.g., the center of a circular surface or a wafer). The megasonic energy is preferably maintained while the object is being rotated.

The plurality of transducers preferably comprises at least three colinear transducers, the colinear transducers forming a line parallel with the substantially planar surface, the line extending from an interior portion of the planar surface toward an edge of the planar surface. The transducers are preferably operated at a frequency of about 0.8–6 MHz, more preferably about 1–2 MHz. The phase relationship of the transducers should be such that the progressive wave is maintained during operation of the transducers. Preferably, the transducers are configured to propagate a progressive megasonic wave from the interior portion (e.g. center) of the planar surface to beyond the edge of the planar surface as shown in FIG. 1 and 2.

The method of the invention may be used for any desired liquid contacting. Preferably, the method of the invention comprises treatment of the object under conditions designed to clean or etch the object surface. Cleaning or etching processes may use liquids and treatment conditions (e.g., time, temperature) known in the art to be suitable for accomplishing these tasks with the objects of interest (typically wafers). In general, the methods of the invention preferably involve the use of aqueous liquids. Such liquids may range from simply deionized water to liquids containing controlled amounts of gases, acids, bases, organic solvents, etc. as may be desired to accomplish cleaning and/or etching of the object surface. The action of the progressive megasonic wave may allow for relaxation of the treatment conditions used and/or improved treatment results for a given set of treatment conditions.

If desired, plural sets of transducers may be simultaneously used as noted above. Also, the method may further include simultaneous treatment of a second surface (preferably substantially planar) of the object. In such instances, the method would include contacting the second surface with a second liquid (identical or different from the liquid used in propagating the progressive megasonic wave).

What is claimed is:

1. An apparatus for contacting a substantially planar surface of an object with a liquid, said apparatus comprising:

(a) means for holding said object whereby at least a portion of said planar surface is exposed;

(b) means for supplying said liquid whereby at least a portion of said liquid is brought into contact with said exposed planar surface;

(c) a plurality of transducers in contact with said liquid near said exposed planar surface, said transducers being capable of operating at megasonic frequencies and said transducers being sufficiently proximate such that a progressive megasonic wave may be formed in said liquid near said exposed surface; and (d) an electronic means for controlling the operating frequency of said transducers and a phase relationship of said transducers in a manner to create a progressive megasonic wave in said liquid near said exposed surface.

2. The apparatus of claim 1 wherein said apparatus further comprises means for moving said object in a plane parallel with said planar surface whereby different portions of said planar surface are contacted by said liquid.

3. The apparatus of claim 2 wherein said means for moving said object comprises a means for rotating said object in a plane parallel with said planar surface.

4. The apparatus of claim 3 wherein said means for holding said object comprises a plurality of gripping members for gripping edges of said object and said rotating means comprises means for rotating said gripping members in a plane parallel with said planar surface.

5. The apparatus of claim 4 wherein said gripping members are attached to a common axial member and said means for rotating comprises a means for rotating said axial member.

6. The apparatus of claim 5 wherein said gripping members are adapted to hold a substantially planar sheet object.

7. The apparatus of claim 6 wherein said gripping members are adapted to hold a substantially circular wafer having a second substantially planar surface.

8. The apparatus of claim 7 further comprising means for supplying a liquid to said second substantially planar surface of said wafer.

9. The apparatus of claim 1 wherein said plurality of transducers comprises at least three transducers which are colinear in a plane parallel with said planar surface.

10. The apparatus of claim 9 wherein at least three of said transducers form a line extending from an interior region of said planar surface toward an outer edge of said planar surface.

11. The apparatus of claim 10 wherein said electronic means is capable of creating a progressive megasonic wave having a direction of progression along said line.

12. The apparatus of claim 10 wherein said supplying means includes a tube for supplying a liquid between said transducers and said planar surface.

13. The apparatus of claim 12 wherein said tube has an outlet for said liquid at said interior region.

14. The apparatus of claim 1 wherein said means for holding said object comprises means for gripping said object.

15. The apparatus of claim 14 wherein said gripping means comprises a plurality of grips for holding portions of an edge of said object.

16. The apparatus of claim 1 wherein said gripping means comprises a source of vacuum suction and a contact tube for applying said vacuum suction against a surface of said object.

17. The apparatus of claim 1 further comprising a containing member for containing said plurality of transducers.

18. The apparatus of claim 1 further comprising a collection tank for collecting liquid supplied by said supplying means.

* * * * *